United States Patent [19]

Hornak

[11] Patent Number: 4,825,103
[45] Date of Patent: Apr. 25, 1989

[54] SAMPLE-AND-HOLD CIRCUIT

[75] Inventor: Thomas Hornak, Portola Valley, Calif.

[73] Assignee: Hewlett-Packard Company, Palo Alto, Calif.

[21] Appl. No.: 38,105

[22] Filed: Apr. 14, 1987

[51] Int. Cl.⁴ .................... H03K 5/06; G11C 27/02
[52] U.S. Cl. ..................... 307/353; 307/267; 307/606; 307/605; 328/151
[58] Field of Search ............... 307/267, 353, 352, 501, 307/518, 584, 594, 605, 606; 328/151, 65; 333/19, 20, 166

[56] References Cited

U.S. PATENT DOCUMENTS

| | | | |
|---|---|---|---|
| 2,912,601 | 11/1959 | Slatten, Jr. | 328/65 |
| 3,278,846 | 10/1966 | Patten et al. | 307/267 |
| 3,906,400 | 9/1975 | Gooding et al. | 333/166 |
| 4,227,160 | 10/1980 | Tamori et al. | 333/166 |
| 4,291,286 | 9/1981 | Wagner | 333/166 |

OTHER PUBLICATIONS

J. L. Anderson, Single-Pulse Sampling Circuit, IBM Tech. Disc. Bulletin, vol. 9, No. 4, Sep. 1966, p. 381.
One Gigasample per Second Transient Recorder: A Performance Demonstration IEEE Trans. on Nuclear Science, vol. NS30, No. 1, Feb. 1983, pp. 278-282.

Primary Examiner—John Zazworsky
Attorney, Agent, or Firm—Paul L. Hickman

[57] ABSTRACT

A sample-and-hold circuit distinguished by its lack of a storage capacitor. The circuit includes a delay line and a signal following circuit coupled to the delay line which is synchronized with the delay line's propagation rate. In several embodiments of the invention a multitap delay line is used, and the signal following circuits variously include an electronic switch or linear interpolation circuits. In several other embodiments of this invention a gate of a FET is used as the delay line, and the signal following circuits include the drain and source of the FET. By substituting a delay line and signal following means for a storage capacitor, extremely fast sample-and-hold circuits may be obtained.

28 Claims, 7 Drawing Sheets

SAMPLE-AND-HOLD CIRCUIT

FIELD OF THE INVENTION

This invention relates generally to sample-and-hold and track-and-hold circuits.

DESCRIPTION OF THE PRIOR ART

Sample-and-hold circuits are designed to sample the instantaneous voltage level of a source signal at an input, and then hold that voltage level at an output for a predetermined period of time. Sample-and-hold circuits are sometimes referred to as track-and-hold circuits if the sampling period is relatively long.

In the prior art, sample-and-hold circuits typically used a capacitor to store the instantaneous voltage level of the source signal. A typical prior art sample-and-hold circuit includes a pre-amplifier, a post-amplifier, a storage capacitor coupled to the input of the post-amplifier, and an electronic switch coupling the output of the pre-amplifier to the input of the post-amplifier. When the electronic switch is rapidly closed and then opened, the capacitor quickly charges to and then holds the voltage level of the source signal at that instant in time. Assuming that there is minimal charge leakage from the capacitor, the voltage level at the output of the post-amplifier will remain relatively stable.

Prior art sample-and-hold circuits exhibit problems at higher frequencies of the source signal. This is because the pre-amplifier and the switch each have an associated series resistance which, when combined with the capacitance of the storage capacitor, results in an RC network having an appreciable time constant. If the time constant is large, the sample-and-hold circuit may not be able to adequately respond to high frequency source signals.

To make the time constant as small as possible, it is desirable to reduce the capacitance of the storage capacitor. However, very small storage capacitors, due to inevitable internal and external leakage, can only hold charges for short periods of time. Also, as the storage capacitors are made smaller, the inherent feed-through capacitance of the electronic switch in its off-state becomes relatively more significant, reducing the accuracy of the sample-and-hold circuit.

SUMMARY OF THE INVENTION

An object of this invention is to provide a sample-and-hold circuit which can be used with high frequency source signals.

Another object of this invention is to provide a sample-and-hold circuit which does not require a capacitor as a storage element.

Briefly, the invention includes a delay line and a signal following circuit coupled to the delay line and synchronized with the propagation rate of the source signal as it travels down the delay line. The delay line can take many forms, including an electromagnetic transmission line in the form of a strip line, coaxial line, a Field Effect Transistor (FET) gate, an optical delay line, an acoustical delay line, etcetera. The signal following circuit can also take many forms including an electronic switch, electronic summation circuits, and the source/drain of a FET.

An advantage of this invention is that a sample-and-hold circuit is provided which can operate without the need for a capacitive storage element. As a result, the sample-and-hold circuit of the present invention can be used with very high frequency source signals. In fact, since short delay lines are easier to produce than long delay lines, the present invention tends to become more practical as the sampling frequency increases.

An advantage of the FET embodiment of the present invention is that it can be incorporated into a monolithic integrated circuit resulting in smaller, more efficient, and more reliable systems.

These and other objects and advantages of the present invention will become apparent to those skilled in the art after reading the following descriptions and studying the various figures of the drawing.

DETAILED DESCRIPTION OF THE PREFERRED EMBODIMENTS

Figure 1:
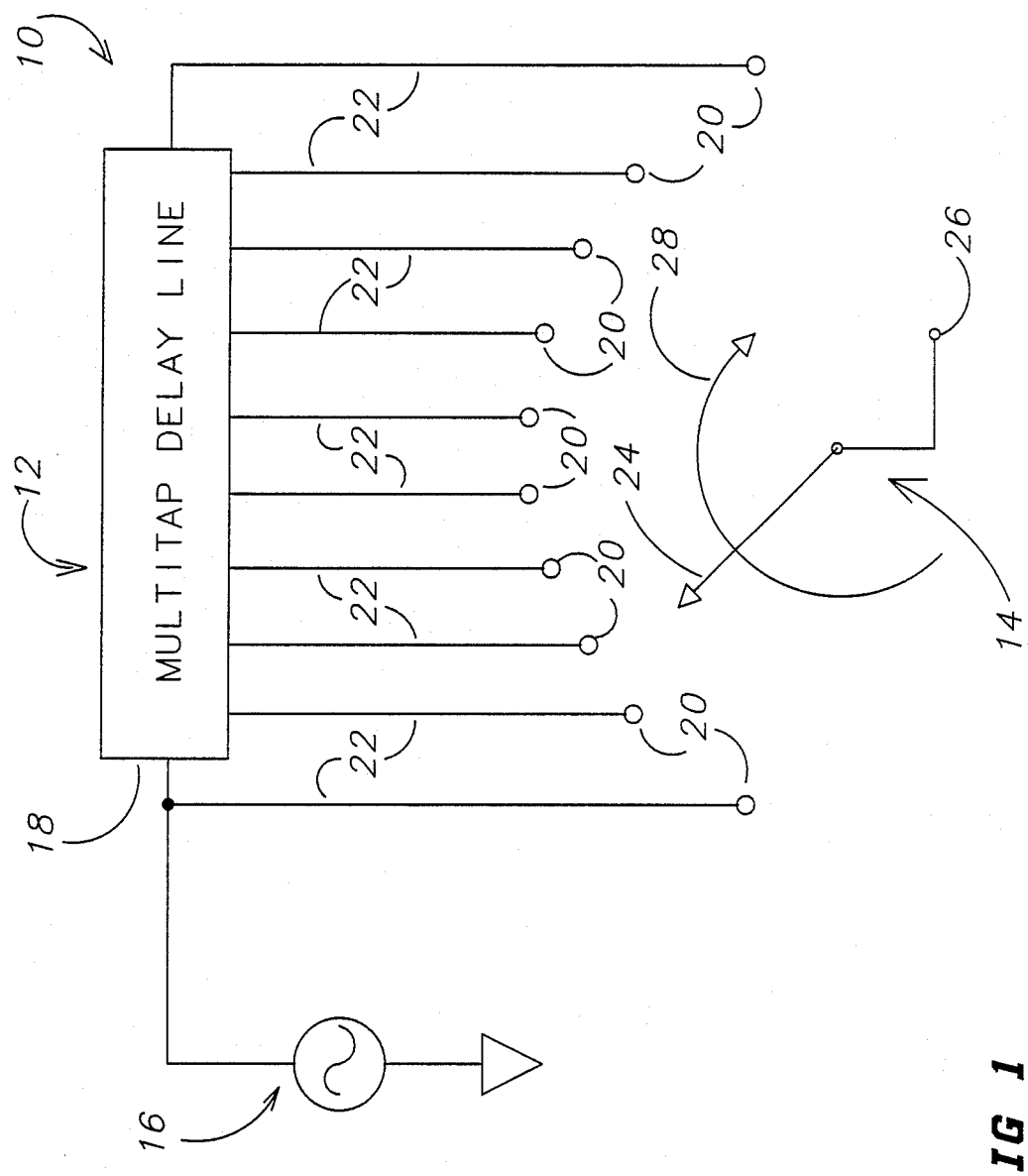
FIG. 1 is a schematic of a sample-and-hold circuit in accordance with the present invention.

Referring to FIG. 1, a sample-and-hold circuit 10 in accordance with the present invention includes delay means in the form of a multi-tap delay line 12, and signal following means in the form of a switch 14. A signal source 16 is coupled to an input 18 of the multi-tap delay line 12.

The delay line 12 can take many forms, including a conventional electromagnetic delay line, an optical delay line, an acoustical delay line, etcetera. For this embodiment of the present invention, the number of taps of the delay line 12 should be relatively large.

Switch 14 includes a number of contacts 20 which are coupled to taps 22 of the multi-tap delay line 12. Switch 14 also includes a rotary wiper 24 and an output contact 26. The wiper 24 is sequentially coupled to the contacts 20 as it "rotates", as suggested by the arcuate arrow 28. Of course, the actual implementation of switch 14 would indubitably be electronic, but would operate much like the mechanical analogy set forth above.

In operation, when a signal is applied to input 18 of the multi-tap delay line 12, it will be spatially transmitted through the delay line at a predetermined propagation rate. Because switch 14 is synchronized with the propagation rate of the multi-tap delay line, the voltage output at contact 26 will be the instantaneous voltage level of the signal source waveform. In other words, the output at contact 26 will be a sample-and-hold signal.

Of course, the sample-and-hold signal output of circuit 10 will be distorted unless a very large number of taps 22 are provided. Furthermore, the design of switch 14 tends to be complex and expensive. In consequence, the embodiments of FIGS. 2A and 3A have been developed to produce good sample-and-hold signal outputs while using a multi-tap delay line having a relatively small number of taps.

Figure 2A:
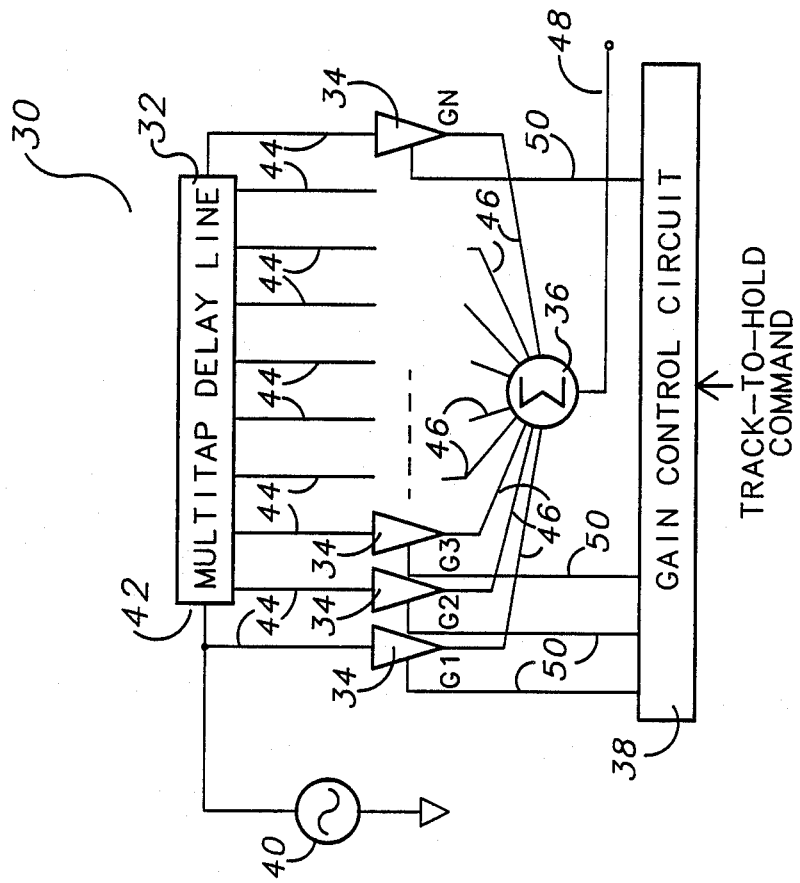
FIG. 2A is a schematic of a first alternate embodiment of a sample-and-hold circuit in accordance with the present invention.

Referring to FIG. 2A, a first alternate embodiment for a sample-and-hold circuit 30 in accordance with the present invention includes a multi-tap delay line 32, a number of variable gain amplifiers 34, a summation circuit 36, and a gain control circuit 38. A signal source 40 is coupled to an input 42 of multi-tap delay line 32.

The inputs of variable gain amplifiers 34 are coupled to the taps 44 of multi-tap delay line 32. The outputs of variable gain amplifiers 34 are coupled to input lines 46 of summation circuit 36, and the output of summation circuit 36 is developed upon a line 48. The gains of the amplifiers 34 are controlled by gain control circuit 38 via control lines 50. Examples of waveforms developed by gain control circuit 38 are illustrated in the timing diagram of FIG. 2B.

Figure 2B:
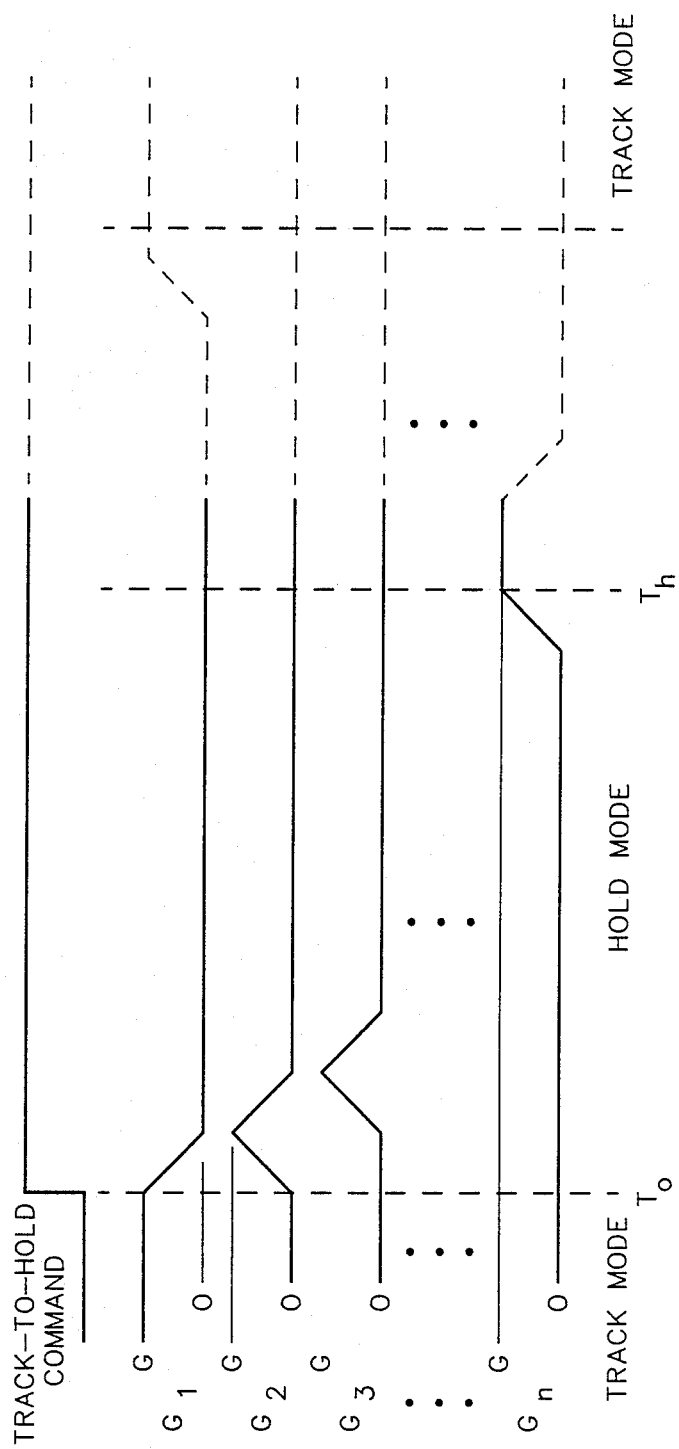
FIG. 2B is a timing diagram of the control signals produced by the gain control circuit of FIG. 2A.

With further reference to FIG. 2B, prior to a time $T_0$ the sample-and-hold circuit is in a track mode. During the period of the track mode, the gain $G_1$ of the first amplifier 34 is at a level G, while the gains $G_2$, $G_3$, ... $G_N$ are at a zero gain level. Consequently, the signal on output line 48 will follow the input signal developed by signal source 40.

After time $T_0$, a track-to-hold command is given to the gain control circuit, and the gain $G_1$ of the first amplifier 34 begins to fall in a linear fashion. Simultaneously, the gain $G_2$ of the second amplifier begins to rise linearly with exactly the opposite slope with which the gain $G_1$ is falling. By the time that the gain $G_1$ reaches zero, the gain $G_2$ of the second amplifier 34 reaches G.

Once the second amplifier 34 reaches its maximum gain of G, its gain begins to fall linearly towards zero, and the gain $G_3$ of the third amplifier 34 begins to rise linearly. Thus, a series of triangular waveforms offset by one-half "wavelength" are provided by the gain control circuit 38 to the amplifiers 34. This is repeated until the hold period $T_h$ has elapsed.

The progression of the waveforms of FIG. 2B are precisely synchronized with the transmission speed of the input signal travelling down the multi-tap delay line 32. In consequence, the signal level at output line 48 represents the voltage level of the input signal 40 at the time $T_0$ when the track-to-hold command was given. It should be noted that the sum of the gains $G_1$, $G_2$, $G_3$, ..., $G_N$ exactly equals the maximum gain G for the entire period from $T_0$ to $T_h$.

The embodiments of FIGS. 1 and 2A utilize multi-tap delay lines and active signal following means synchronized with the signal travelling through the delay line. However, in FIG. 3A and all subsequent figures the signal is processed before entering the delay line and no active signal following means is required. The processed signal appears successively on subsequent taps and the sample and hold output is essentially a sum of the individual tap voltages.

Figure 3B:
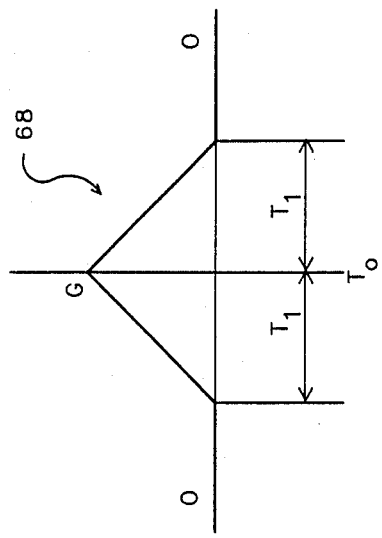
FIG. 3B illustrates the waveform of the gain control signal of FIG. 3A.
Figure 3A:
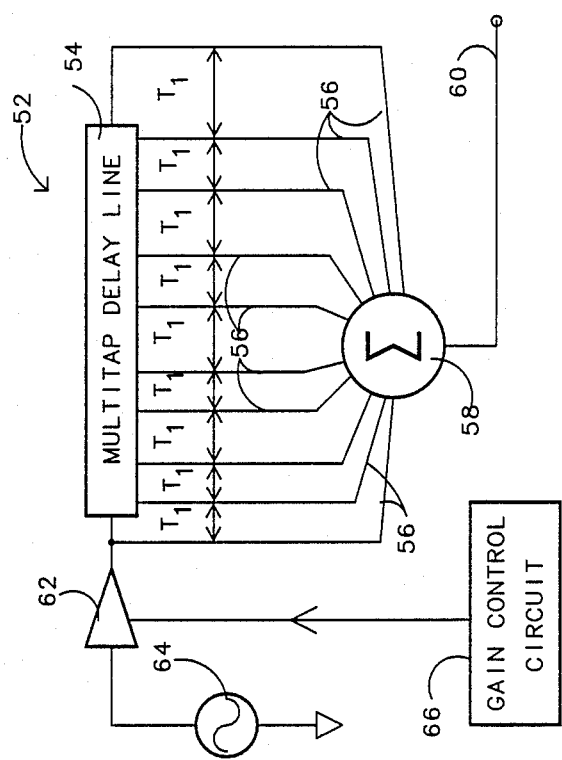
FIG. 3A is a schematic of a second alternate embodiment of a sample-and-hold circuit in accordance with the present invention.

In FIG. 3A, an alternate embodiment of a sample-and-hold circuit 52 in accordance with the present invention includes a multi-tap delay line 54 having a plurality of taps 56, a summation circuit 58 having inputs coupled to the taps 56 and having an output on an output line 60, a variable gain amplifier 62, a signal source 64, and a gain control circuit 66.

The propagation rate of signals through multi-tap delay line 54 is such that it takes a time $T_1$ for the signal to travel between adjacent taps 56. The gain control circuit 66 develops a sampling pulse 68 as shown in FIG. 3B which starts at a level of zero gain at a $T_0-T_1$, rises linearly to a gain level G at time $T_0$, and falls linearly to zero gain at a time $T_0+T_1$. Since the rise time and fall time of sampling pulse 68 are both exactly as large as the time separation between adjacent taps 56, the cumulative inputs to summation circuit 58 are synchronized with the delay pulse travelling down the multi-tap delay line 54. In other words, commencing at the time $T_0$, the input signal from signal source 64 will be held for a period $(N-1) \times T_1$, where N equals the number of taps of the multi-tap delay line 54.

The embodiment of FIG. 1 requires a very large number of taps in order to produce a reasonably accurate output, while the embodiments of FIGS. 2A and 3A use various interpolation techniques to achieve reasonable sample-and-hold results from a delay line having far fewer taps. However, with the embodiment of FIG. 4 it will be shown that it is possible to produce a delay line having a very large number of taps and, with the embodiments of FIGS. 5 and 6, it will be shown that it is possible to produce a delay line having, essentially, an infinite number of taps.

Figure 4:
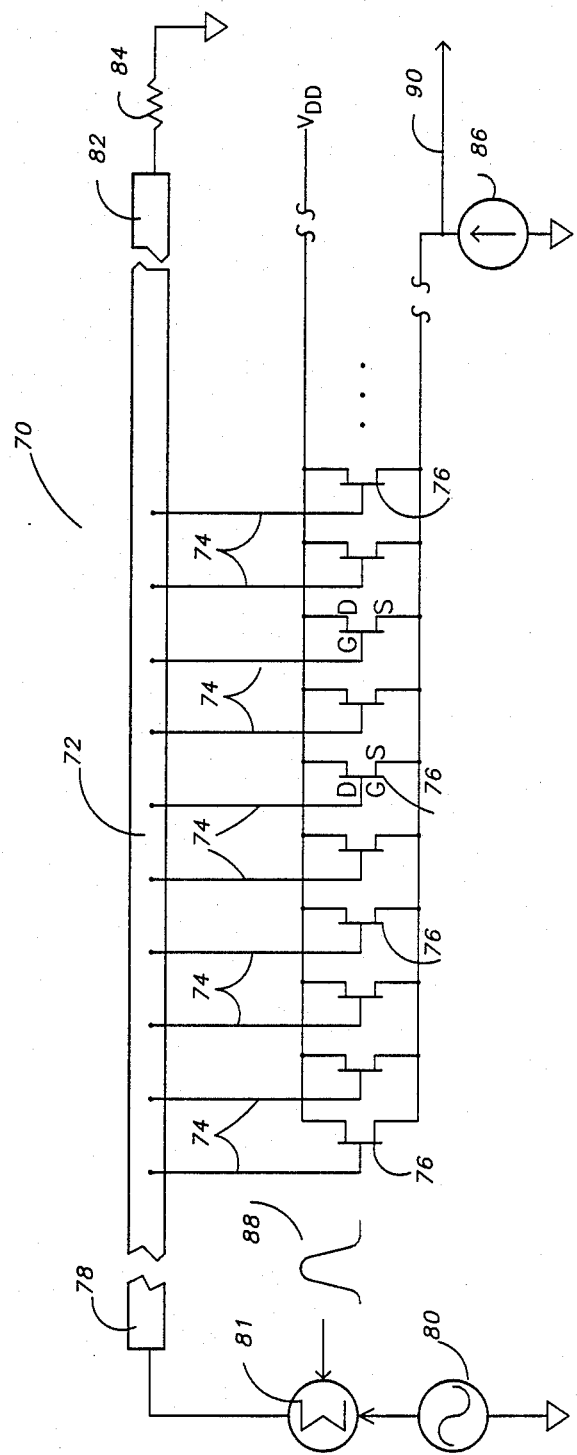
FIG. 4 is a schematic of a third alternate embodiment for a sample-and-hold circuit in accordance with the present invention.

In FIG. 4, an alternate embodiment of the sample-and-hold circuit is shown which utilizes Field Effect Transistor (FET) Integrated Circuit (IC) technology. The sample-and-hold circuit 70 includes a delay line 72 having a number of taps 74 coupled to the gates of a number of FETs 76. An input end 78 of delay line 72 is coupled to a signal source 80 by a signal processing circuit 81. An output end 82 of delay line 72 is coupled to ground by an impedance matching resistor 84.

As shown in FIG. 4, the drains of the FETs 76 are directly coupled to the voltage source $V_{DD}$, and the sources of FETs 76 are coupled to ground by a constant current source 86. The output 90 is taken from the FET 76 sources. Alternatively, the sources of FETs 76 may be grounded and their drains may be connected to a voltage source $V_{DD}$ by means of a resistive load, with the output signal taken from the drains of the FETs.

The signal processing circuit 81 can be a simple, normally-off electronic switch which can be made to conduct by a sampling pulse 88. A section of the signal from signal source 80 of a duration equal to the duration of sampling pulse 88 is then caused to propagate down the delay line 72. Due to this IC implementation, the density of taps and the number of FETs can be made so high that the length of the delay line covered by the propagating signal section encompasses many tens, hundreds, or thousands of taps and FETs, resulting in little distortion of the output sample-and-hold signal. As a result, a reasonably accurate output can be obtained without the interpolation techniques that were required with the embodiments illustrated in FIGS. 2A and 3A.

Figure 5:
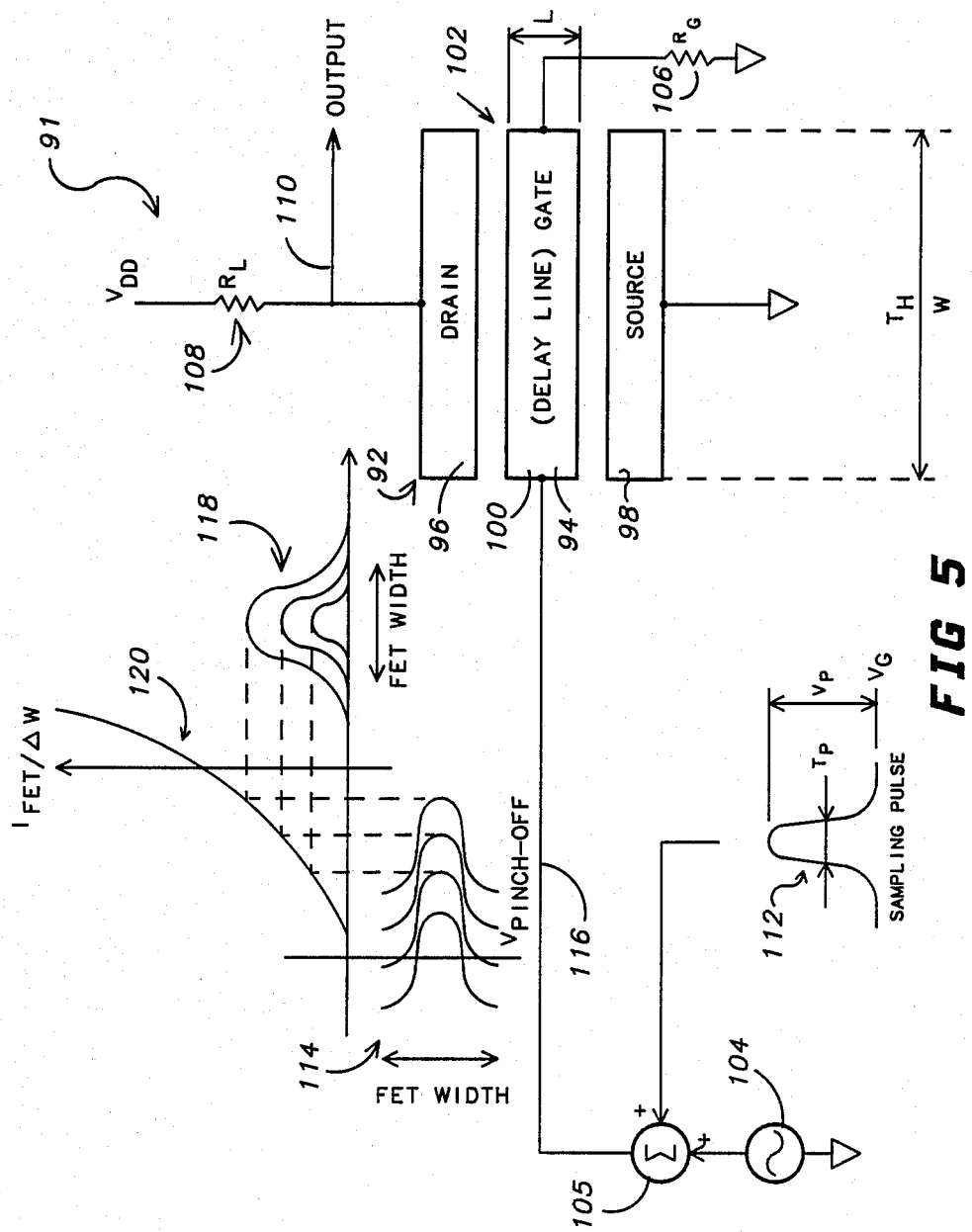
FIG. 5 is a schematic of a fourth alternate embodiment of a sample-and-hold circuit in accordance with the present invention.
Figure 6:
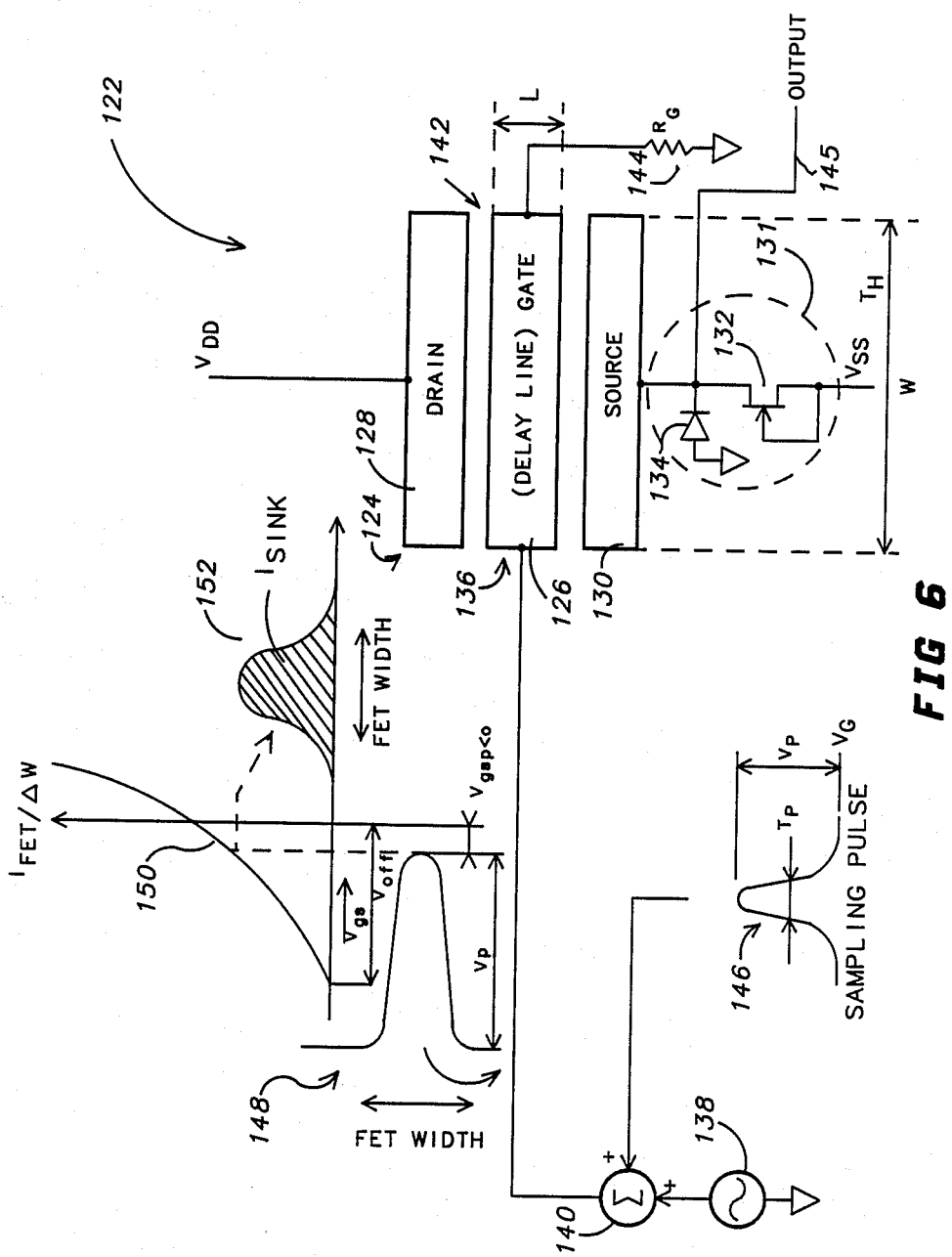
FIG. 6 is a schematic of a fifth alternate embodiment of a sample-and-hold circuit in accordance with the present invention.

Going further still, as shown in FIGS. 5 and 6, an essentially infinite tap density can be realized by merging the sources and drains of the many FETs shown in FIG. 4 into the source and drain, respectively, of a single, very wide FET having a gate serving as the delay line. Alternatively, the gate could be intimately connected, along its length, to a separate, parallel delay line. The output signal can be taken from the drain (FIG. 5) or from the source (FIG. 6).

In FIG. 4, if the inactive FETs (i.e. the FETs in front or behind the propagating signal section) are biased such that they are conductive, excessive IC power dissipation could result. The same is true with the embodiments shown in FIGS. 5 and 6, if the inactive sections of the single wide FET are conducting current. It is therefore advantageous to keep the inactive parts of the circuit biased to an off-state. This can be achieved by choosing a summation circuit as the signal processing element 81, 105, and 140 in FIGS. 4, 5, and 6 respectively, and by properly biasing the sampling pulse.

More specifically, with reference to FIG. 4, when a properly biased sampling pulse 88 is applied to summation circuit 81, the sum of the sampling pulse and the signal supplied by signal source 80 is applied to input end 78 and travels down the delay line 72. Only the combined voltage levels of sampling pulse 88 and the voltage of the signal source 80 are above the threshold of the gates of FETs 76 and thus, assuming that the FET sources are grounded, sequentially turn on the FETs 76 in proportion to the voltage level produced by signal source 80 at the time that the sampling pulse 88 is introduced into the summation circuit 81. The drain currents of the sequentially turned on FETs then produce a voltage proportional to the sampled portion of the signal across a load coupled to the drain. This voltage will remain unchanged during each sample's propagation time, thereby constituting a "hold" function.

If the sources are grounded via a constant current source and the drains are connected directly to $V_{DD}$, the FETs sequentially turned on by the propagating combined signal and sampling pulse (and therefore having the highest instantaneous gate voltage) carry the entire current of current source 86 and ensure that the other FETs are in an off-state.

The FETs sequentially turned on by the propagating sample carry a fixed current determined by current source 86, which is independent of the sample voltage. The gate/source voltages of the sequentially turned on FETs are also fixed and independent of the sample voltage. The voltage on output 90, which is approximately equal to the source voltage of the sequentially turned on FETs, will therefore follow the voltage of the subsequent samples propagating along the delay line with an offset equal to the fixed gate/source voltage, and thus with minimum distortion. This, again, constitutes a "hold" function.

With reference to FIG. 5, a FET 92 is used both as a delay line (or as a part thereof) and as a summation circuit. More specifically, the FET 92 includes a gate 94, a drain 96, and a source 98, where the gate 94, drain 96, and source 98 have a width W, and the gate 94 has a length L.

The gate 94 serves as a delay line for delay line input signals applied to an input 100 of FET 92. The input 100 is coupled to a signal source 104 by a summation circuit 105. A resistor 106 having a resistance $R_G$ equal to the characteristic impedance of delay line/gate 94 is attached to output end 102 of the delay line/gate 94 to minimize signal reflection at the end of the gate. The source 98 is grounded, and the drain 96 is coupled to a voltage source $V_{DD}$ by a load resistor 108 having a resistance $R_L$. The output line 110 of sample-and-hold circuit 91 is coupled to the drain 96.

When a sampling pulse 112 having a height $V_p$ and a width $T_p$ is applied to an input of summation circuit 105, a delay line input 114 which exceeds $V_{pinch-off}$ or the threshold voltage of the gate 94 is developed on an input line 116. This pulse travels down the gate 94 and produces a current distribution along the FET width as indicated by waveforms 118.

Curve 120 represents the transfer characteristic of FET 92, i.e., the drain current per unit width vs. the gate-to-source voltage. The total drain current $I_{FET}$ is equal to the area under the waveforms shown at 118. It will be noted that this area and thus the current $I_{FET}$ flowing through the FET 92 is nonlinearly dependent upon the voltage level provided by the signal source 104 due to both the curvature of transfer characteristic 120 as well as by variations in the width of the conductive section of the FET. This nonlinear dependence can distort the output signal developed on output line 110. This problem can be alleviated by providing a constant current source, and by taking the output voltage from the FET source as will be discussed in greater detail with reference to FIG. 6.

In FIG. 6, a sample-and-hold circuit 122 includes FET 124 having a gate 126, a drain 128, and a source 130. The drain is coupled to a voltage source $V_{DD}$, and the source is coupled to a voltage source $V_{SS}$ by a constant current source 131 including a FET 132 and a diode 134. An input end 136 of gate 126 is coupled to a signal source 138 by a summation circuit 140. An output end 142 of gate 126 is coupled to ground by a resistor 144 having the same resistance $R_G$ as the characteristic impedance of gate 126. As was discussed with reference to the embodiment of FIG. 5, the resistor 144 is used for impedance matching purposes to minimize reflections of the delayed signal travelling down the gate 126.

When a sampling pulse 146 having a height $V_p$ and a width $T_p$ is applied to an input of summation circuit 140, a delay line input signal 148 is developed which is above the threshold voltage $V_{off}$ of the FET 124. The constant current source 131 ensures a constant current flow through the FET 124, and thus a fixed operating point on curve 120 (rendering its nonlinearity immaterial) and a fixed width of the conductive section of the FET. This results in a fixed voltage difference between the pulse peak on the delay line/gate and output line 145 and thus in an undistorted output voltage. In consequence, the output signal on output line 14 is representative of the voltage level produced by signal source 138 at the time that the sampling pulse 146 is introduced into the summation circuit 140. The hold period $T_h$ of the sample-and-hold circuit 122 is equal to the time that it takes the delay input signal 148 to travel the width W of the gate 126.

It should be noted that the embodiments described above are intended to teach those skilled in the art how to make and use various forms of the present invention. Practical sample-and-hold circuits within the spirit and scope of the present invention may differ from the described embodiments in specific engineering details.

For example, in various embodiments of this invention, it should be immediately apparent to those skilled in the art that the delay line should be partially circular. For example, in FIG. 4, the delay line 72 in a practical sample-and-hold circuit would probably be partially circular, with the output 90 positioned at the center, and with the FETs 76 radially extending therebetween to minimize signal delay differences between the sources of the FETs 76 and the output 90. In FIGS. 5 and 6, the gates 94 and 126, respectively, would probably be partially circular for the same reason. Of course, with the embodiment of FIG. 5, the drain 96 would be positioned within the arc of the gate 94, with the source 98 being curved around the periphery of the gate 94, while with the embodiment of FIG. 6 the opposite would be the case.

While this invention has been described with reference to several preferred embodiments, it is contemplated that various alterations and permutations of the invention will become apparent to those skilled in the art upon a reading of the preceding descriptions and a study of the drawing. It is therefore intended that the scope of the present invention be determined by the following appended claims.

What is claimed is:

1. A sample-and-hold circuit comprising:
   delay means adapted for the spatial transmission at a predetermined propagation rate of a signal applied to an input thereof; and
   signal following means for sequentially sensing the level of a first segment of said signal at progressive sections of said delay means in synchronization with said propagation rate so as to provide a substantially constant output corresponding to said level.

2. A sample-and-hold circuit as recited in claim 1 wherein said delay means includes a delay line having a plurality of taps, and wherein said signal following means includes switch means coupled to said plurality of taps.

3. A sample-and-hold circuit as recited in claim 1 wherein said delay means includes a delay line having a plurality of taps, and wherein said signal following means includes:
   input means responsive to a source signal and operative to develop a delay input signal as an input to said delay means; and
   output means coupled to said taps and operative to develop a sample-and-hold signal.

4. A sample-and-hold circuit as recited in claim 3 wherein said output means comprises summation means having inputs coupled to said taps.

5. A sample-and-hold circuit as recited in claim 4 wherein said summation means includes a plurality of amplifier means coupled to said taps of said delay line.

6. A sample-and-hold circuit comprising:
   delay means adapted for the spatial transmission at a predetermined propagation rate of a signal applied to an input thereof, said delay means having a plurality of taps; and
   signal following means for sequentially sensing the level of a first segment of said signal at progressive sections of said delay means in synchronization with said propagation rate so as to provide a substantially constant output corresponding to said level, said signal following means including
   summation means having a plurality of inputs and an output, where said inputs of said summation means are coupled to said tape;
   variable amplifier means having an input coupled to a signal source and having an output coupled to said delay means; and
   control means coupled to said variable amplifier means to systematically vary its gain.

7. A sample-and-hold circuit as recited in claim 6 wherein said control means develops a sampling pulse.

8. A sample-and-hold circuit comprising:
   delay means adapted for the spatial transmission at a predetermined propagation rate of a signal applied to an input thereof, said delay means including a delay line having a plurality of taps; and
   signal following means for sequentially sensing the level of a first segment of said signal at progressive sections of said delay means in synchronization with said propagation rate so as to provide a substantially constant output corresponding to said level, said signal following means including
   input means responsive to a source signal and operative to develop a delay input signal as an input to said delay means, said input means including a variable amplifier responsive to said source signal and operative to develop said delay input signal, and gain control means coupled to said variable amplifier, and
   output means coupled to said taps and operative to develop a sample-and-hold signal.

9. A sample-and-hold circuit comprising:
   delay means adapted for the spatial transmission at a predetermined propagation rate of a signal applied to an input thereof, said delay means including a delay line having a plurality of taps; and
   signal following means for sequentially sensing the level of a first segment of said signal at progressive sections of said delay means in synchronization with said propagation rate so as to provide a substantially constant output corresponding to said level, said signal following means including
   input means responsive to a source signal and operative to develop a delay input signal as an input to said delay means, said input means including summation means having a first input coupled to said source signal and a second input coupled to a sampling signal, said summation means being operative to develop said delay input signal, and
   output means coupled to said taps and operative to develop a sample-and-hold signal.

10. A sample-and-hold circuit comprising:
    delay means adapted for the spatial transmission at a predetermined propagation rate of a signal applied to an input thereof, said delay means including a delay line having a plurality of taps; and
    signal following means for sequentially sensing the level of a first segment of said signal at progressive sections of said delay means in synchronization with said propagation rate so as to provide a substantially constant output corresponding to said level, said signal following means including
    input means responsive to a source signal and operative to develop a delay input signal as an input to said delay means, and
    output means coupled to said taps and operative to develop a sample-and-hold signal, said output means including summation means having inputs coupled to said taps, said summation means including a plurality of amplifier means coupled to said taps of said delay line, said plurality of amplifier means including a plurality of field effect transistors having gates coupled to said taps.

11. A sample-and-hold circuit as recited in claim 10 wherein said field effect transistors are coupled to a constant current source.

12. A sample-and-hold circuit comprising:
    delay means for spatially transmitting a delay input signal at a predetermined propagation rate, said delay input signal being characterized by a series of signal values, said delay input signal having a segment substantially characterizable by a single signal level; and output means coupled to said delay means and synchronized with said propagation rate such that said output means is sequentially responsive to said segment of said delay input signal as it travels through progressive sections of said delay means within a sample-and-hold period so as to provide a substantially constant output corresponding to said single signal level.

13. A sample-and-hold circuit comprising:

delay means for spatially transmitting a delay input signal at a predetermined propagation rate said delay input signal being characterized by a series of signal values, said delay input signal having a segment substantially characterizable by a single signal level, said delay means including a delay line; and output means coupled to said delay means and synchronized with said propagation rate such that said output means is sequentially responsive to said segment of said delay input signal as it travels through progressive sections of said delay means within a sample-and-hold period so as to provide a substantially constant output corresponding to said single signal level.

14. A sample-and-hold circuit as recited in claim 13 wherein said delay line includes a plurality of spatially separated taps.

15. A sample-and-hold circuit as recited in claim 14 wherein said output means includes summation means coupled to said taps.

16. A sample-and-hold circuit as recited in claim 15 wherein said output means further includes a plurality of variable amplifiers coupling said taps to said summation means.

17. A sample-and-hold circuit as recited in claim 15 further including input means responsive to a source signal and operative to develop said delay input signal.

18. A sample-and-hold circuit as recited in claim 15 further including input means responsive to a source signal and operative to develop said delay input signal, said input means including a variable amplifier and control means coupled to said variable amplifier for systematically varying its gain.

19. A sample-and-hold circuit as recited in claim 15 further including input means responsive to a source signal and operative to develop said delay input signal, said input means including summation means having inputs coupled to said source signal and to a sampling signal.

20. A sample-and-hold circuit as recited in claim 14 wherein said output means includes a plurality of transistors coupled to said taps.

21. A sample-and-hold circuit as recited in claim 20 wherein said transistors are field effect transistors having their gates coupled to said taps.

22. A sample-and-hold circuit as recited in claim 21 wherein said field effect transistors are coupled to a constant current source.

23. A sample-and-hold circuit comprising:

delay means for spatially transmitting a delay input signal at a predetermined propagation rate said delay input signal being characterized by a series of signal values, said delay input signal having a segment substantially characterizable by a single signal level, said delay means including a gate of a field effect transistor; and output means coupled to said delay means and synchronized with said propagation rate such that said output means is sequentially responsive to said segment of said delay input signal as it travels through progressive sections of said delay means within a sample-and-hold period so as to provide a substantially constant output corresponding to said single signal level.

24. A sample-and-hold circuit as recited in claim 23 wherein said output means comprises a source and a drain of said field-effect transistor.

25. A sample-and-hold circuit as recited in claim 24 further comprising input means coupled to said gate and operative to develop said delay input signal.

26. A sample-and-hold circuit as recited in claim 25 wherein said input means includes summation means having a first input coupled to a signal source, a second input coupled to a sampling pulse source, and an output coupled to said gate.

27. A sample-and-hold circuit as recited in claim 24 wherein said delay input signal is applied to a first end of said gate, and further comprising impedance matching means coupled to a second end of said gate.

28. A sample-and-hold circuit as recited in claim 24 further comprising a constant current source coupled to said field effect transistor.

* * * * *